United States Patent [19]
Stein

[11] 3,968,480
[45] July 6, 1976

[54] MEMORY CELL

[75] Inventor: Jeffrey P. Stein, Hatfield, Pa.

[73] Assignee: Honeywell Inc., Minneapolis, Minn.

[22] Filed: Mar. 20, 1975

[21] Appl. No.: 560,217

Related U.S. Application Data

[63] Continuation of Ser. No. 463,895, April 25, 1974, abandoned.

[52] U.S. Cl. .................. 340/173 FF; 340/173 R; 340/173 DR; 340/173 CA
[51] Int. Cl.² ................ G11C 13/00; G11C 11/40
[58] Field of Search... 340/173 R, 173 DR, 173 CA, 340/173 SP

[56] References Cited
UNITED STATES PATENTS

| | | | |
|---|---|---|---|
| 2,066,614 | 1/1937 | Dohle | 340/173 CA |
| 3,050,673 | 8/1962 | Widmer | 340/173 CA |
| 3,191,158 | 6/1965 | Sherman | 340/173 R |
| 3,668,656 | 6/1972 | Hoggar | 340/173 FF |
| 3,671,946 | 6/1972 | Aagarrd | 340/173 FF |

*Primary Examiner*—Terrell W. Fears
*Attorney, Agent, or Firm*—Laurence J. Marhoefer; Lockwood D. Burton; Mitchell J. Halista

[57] ABSTRACT

A memory system has a data storage element connected by a first memory read device to a first memory output line and by a second memory read device to a second memory output line. A first and a second decoder are connected to the first and second memory read devices, respectively, to read-out data stored in the storage element in response to read address signals applied to the first and second decoders. A "write" operation is effected on the storage element by a write-in device connected between a data input line and the storage element and energized by a third decoder arranged to respond to a write address signal.

10 Claims, 3 Drawing Figures

MEMORY CELL

This is a continuation of application Ser. No. 463,895 filed on Apr. 25, 1974, now abandoned.

BACKGROUND OF THE INVENTION

1. Field of the Invention

The present invention relates to digital computer memories. More specifically, the present invention is directed to a digital computer memory having a plurality of digital data output paths.

2. Description of the Prior Art

All digital computer architectures are based around an array of data storage registers and an arithmetic logic unit (ALU). Data handling operations are performed by accessing data from the storage registers, supplying this data to the ALU where a predetermined operation is performed on the data by a central processing unit (CPU) and writing the resultant modified data back into one of the registers. In the prior art, these arrays of data registers have been implemented by individual flip-flops, small "scratch pad" memories, random access memories, etc. A conventional memory array used as a data storage register storage slows down the operation of the central processing unit (CPU) because, while the CPU can only access one internal location in the memory array at a time, most CPU operations such as addition, subtraction, etc. require two pieces of data for their execution. This type of operation then requires two internal memory operation time intervals in retrieve the two pieces of stored data, or operands. Similarly, during the "write" operation to store the result of the CPU operation, an internal memory time interval is required for the memory array to function as a data storage register.

SUMMARY OF THE INVENTION

The present invention is directed to a technique for implementing the memory register array as a multiple-port, or multiple output line, memory. Using this technique, two operands, or memory locations, can be read, or accessed, at the same time with each one being specified by a separate address. This operation is effective to supply both pieces of stored data to the ALU at the same time and to eliminate the data holding registers at the ALU. Further, it reduces the use of CPU internal memory time by one time interval. The "write" operation is performed in the next internal memory time interval at the locations specified by the address in one or the other of the two address registers. A further embodiment of the present invention enables two operands to be read and one operand written during the same internal memory time interval by providing three addresses and three separate decoders, i.e., two decoders for "read" operations and one for "write" operations. During any one state time, the "read" operations occur near the beginning of the memory time interval and the "write" operation occurs near the end of the memory internal time interval after the ALU has performed its operations on the data and delivered the resulting data to the memory for storage in the memory array. This embodiment even allows writing resultant data back into one of the memory locations that was originally read out to supply one of the operands. The overall timing advantage of this technique provides a three to one improvement in CPU data throughout because it requires only one internal memory state time as opposed to three internal memory state times in the conventional memory array. Further, it provides, by the inclusion of three decoders and corresponding addresses, the complete freedom to access any memory locations and to write into any memory location without any timing restrictions.

An object of the present invention is to provide a memory array having a multiple-port configuration for providing multiple access to the memory operation.

BRIEF DESCRIPTION OF THE DRAWINGS

A better understanding of the present invention may be had when the following detailed description is read in connection with the accompanying drawings, in which.

DESCRIPTION OF THE PREFERRED EMBODIMENT

Detailed Description

Figure 1:
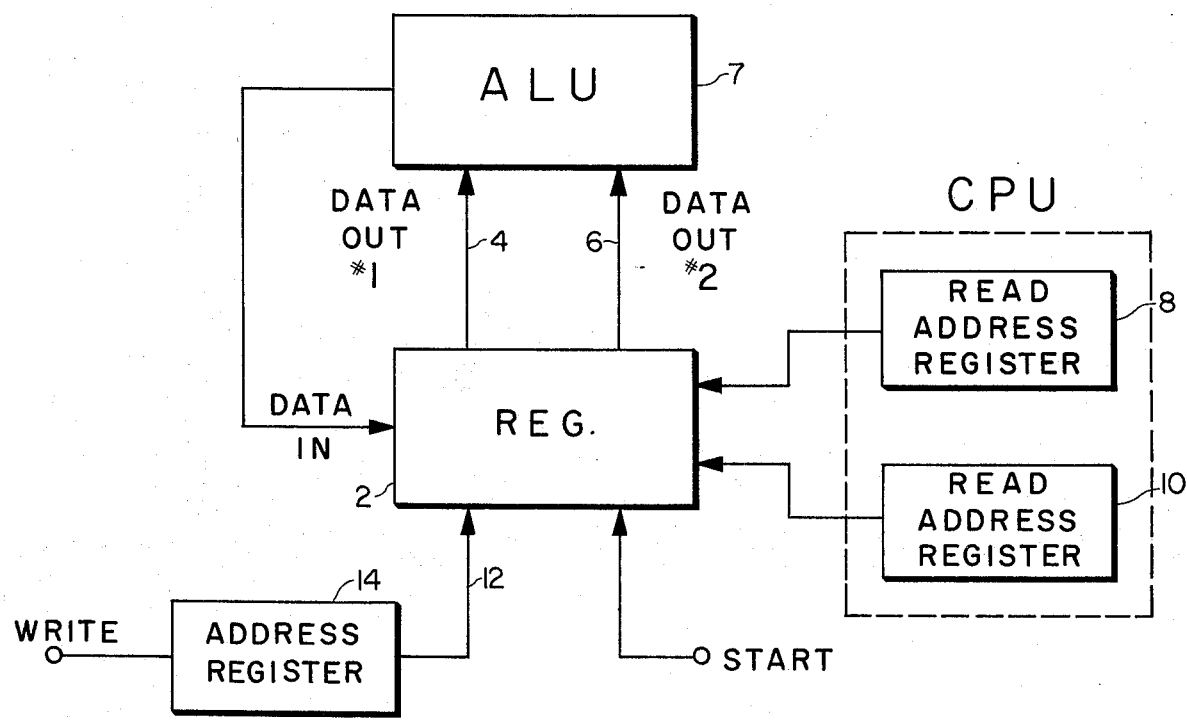
FIG. 1 is a block diagram of a memory array and ALU combination embodying the present invention.

Referring to FIG. 1 in more detail, there is shown a register 2 using a multiport static memory array for its implementation with two read-out ports, or output lines, 4 and 6 connected to an ALU 7. Each output port 4 and 6 is controlled by a corresponding one of a pair of address registers 8 and 10. A "write" port 12 is controlled by its own address register 14 separate from the "read" registers 8 and 10. The "read" registers 8 and 10 can provide "read" operations wherein two different or similar operands may be supplied from the register 2 during the same memory time interval and a "write" operation is performed in the next memory time interval. Each of these operations can be performed with respect to any location within the register 2.

Specifically, the "read" address registers 8 and 10 within the CPU are supplied with a memory address for the desired operands by any suitable means (not shown), such devices being wellknown in the art. These addresses are decoded within the memory register 2 and used to select a pair or operands stored in the memory register 2 either from the same or different memory register locations, as discussed more fully hereinafter. The operands read out from the memory register 2 are applied to the ALU 7 for execution of a desired operation thereon. An output signal from the ALU 7 representing the resultant of the aforesaid operation is applied to the storage register 2 on a Data In line and is stored in a desired memory location under control of a write address register 14 which is, in turn, supplied with a memory location address by any suitable well-known means (not shown). This technique can be extended to a storage register for providing more than two output ports for each stored data bit and to a storage register having a plurality of ALU's with multiport connections controlled by a plurality of respective CPU read registers and a plurality of write address registers. Such a multiple operation would allow many more operations to be performed on a given set of data in the storage register by allowing a plurality of parallel or simultaneous data accesses.

Figure 2:
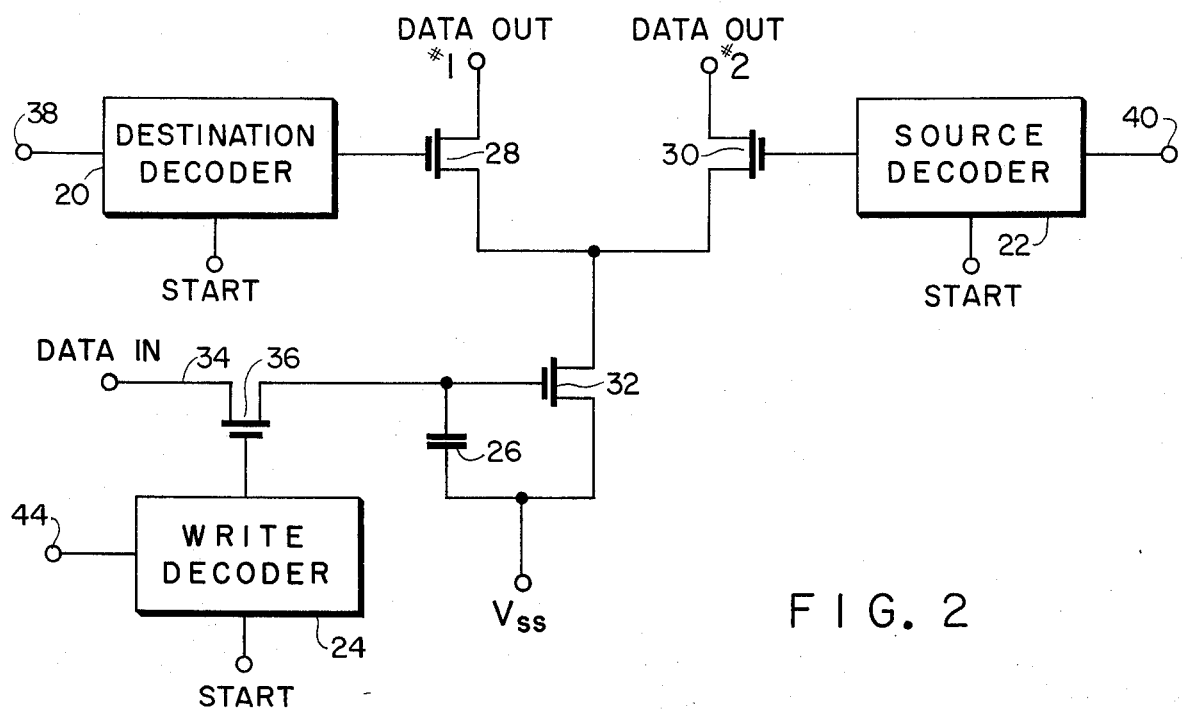
FIG. 2 is a schematic illustration of a memory cell suitable for use with the memory array shown in FIG. 1.

In FIG. 2, there is shown a single memory cell for use in the register 2 of FIG. 1. This implementation is suitable for integration on an integrated circuit chip to form a register array of a plurality of memory cells, or storage locations, while providing the aforesaid multiple-port capability. Each such memory cell provides for multiple access "read" operations by separate "read" decoders 20, 22 while the "write" operation is controlled by a third decoder. The basic storage operation is performed by a data capacitor 26 being either charged or discharged to store a logic 1 or 0, respectively. The "read" decoders 20 and 22 are connected to the gate electrodes of corresponding ones of a pair of "read" devices which are shown as field-effect transistors (FET's) 28 and 30. Specifically, the output of the first "read" decoder 20 is connected to the gate electrode of a first FET 28 while the output of the second "read" decoder 22 is connected to the second FET 30. An output of the first FET 28 is connected to a first data output line No. 1 while an output of the second FET 30 is connected to a second data output line No. 2. An input line of each of the first and second FET's 28 and 30 is connected to the output of a storage device which is a third FET 32. A control, or gate, electrode of the third FET 32 is connected to one side of the data capacitor 26. The other side of the data capacitor 26 and the input of the third FET 32 are connected to an energizing signal source Vss. A Data In line 34 is connected to an input of a fourth FET 36 while the output of the fourth FET 36 is connected to same side of the data capacitor 26 as the control electrode of the third FET 32. The control electrode of the fourth FET 36 is connected to the output of the third decoder 24. The decoders 20, 22 and 24 are provided with input terminals 38, 40 and 44, respectively, for connection to the address registers 8, 10 and 14, previously discussed with reference to FIG. 1, respectively. A "start" input terminal is also provided on the decoders 20, 22 and 24 for connection to a source of a "start", or synchronizing signal, to synchronize the operation of the decoders 20, 22 and 24 with a digital computer clock signal.

MODE OF OPERATION

As previously mentioned, the data capacitor 26 is used to store either a 1 or a 0 representing either a charged state or a discharged state, respectively. If the capacitor 26 is charged, the storage device 32 will be turned "on", and the output lines No. 1 and No. 2 will be connected by a low impedance path through the FET's 28, 30 and 32 to a source of energizing voltage Vss. If the storage capacitor 26 is discharged, the storage device 32 will be turned "off" and the output lines No. 1 and No. 2 will not be connected by a low impedance path to the source Vss. Conversely, "write" operations are performed by turning on the write device, i.e., FET 36, by the decoder 24 to connect the data input line 34 to the data storage capacitor 26 to store a charge for 1 and to effect a lack of a charge for a 0. By operating the "read" devices 28 and 30 at a different time from the "write" device 36 the storage register is operated in a manner to allow complete flexibility in "read" and "write" operations.

Figure 3:
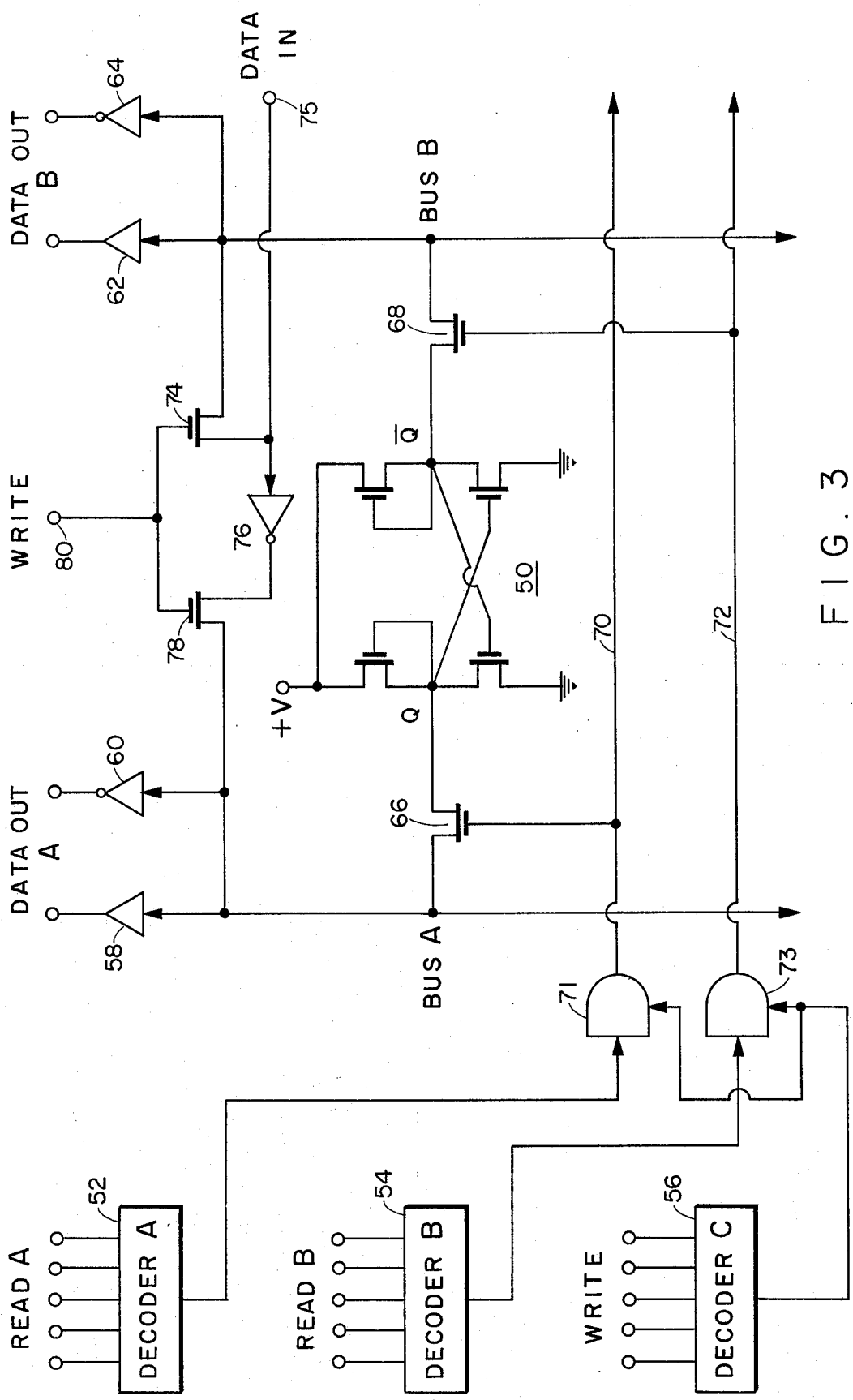
FIG. 3 is a further modification of a memory array, also embodying the present invention.

In FIG. 3, there is shown another embodiment of the present invention using a memory storage register having a plurality of storage elements, e.g., flip-flop data storage element 50, which are each accessed for a data read-out operation by two separate "read" decoders 52, and 54 and for a "write" operation for storing data in the storage device 50 by a third decoder 56. In this system, two operands can be read and one operand written into a memory register during the same memory operation interval time. This is achieved by using three memory addresses and three separate decoders, i.e., two addresses for "read" operations and one address for a "write" operation. During a memory operation interval time, the "read" operations occur during the beginning portion of the memory time interval and the "write" operation occurs during the end portion of the time interval, after the ALU has performed its data handling operations. This technique even allows writing a result back into one of the memory register locations that was originally read out as one of the operands.

A first data bus A is connected to the memory storage elements as hereinafter described and is connected at one end to the inputs of a pair of data amplifiers 58 and 60 with one of the amplifiers being a logical inverter. A second data bus B is similarly connected to the memory storage elements and to the input of an amplifier 62 and a logical inverter 64. The first pair of amplifiers 58 and 60 are connected to respective output terminals to form a data output A. The second pair of amplifiers 62 and 64 are connected to respective output terminals to form a second data output B.

Referring to the typical storage element shown in FIG. 3, one side of the flip-flop storage element 50, i.e., Q output, is connected through a first FET 66 to the bus A while the other side of the flip-flop 50, i.e., Q̄ output, is connected through a second FET 68 to the bus B. The control electrode for the first FET 66 is connected to a first control line 70 while the control electrode for the second FET 68 is connected to a second control line 72. The first control line 70 is connected by a first ORgate 71 to the output of the first decoder 52 and the output of the third decoder 56. The second control line 72 is connected by a second ORgate 73 to the output of the second decoder 54 and the third decoder 56. Thus, the output of the first decoder 52 is used to control the first FET 66 to supply a stored data signal from the flip-flop 50 to the bus A. Similarly, the output of the second decoder 54 is arranged to control the second read-out FET 68 to supply a stored data signal from the other side of the flip-flop 50 to the bus B. Since each of the read-out devices 66, 68 are controlled by a separate decoder, the busses A and B can have output signals from different ones of the plurality of flip-flop storage elements used in the memory register, i.e., the bus A can supply signals from one side of the storage elements selected by the decoder A while the bus B can supply output signals from the other side of the same or different storage elements selected by the second decoder 54. The logical inverters 60 and 64 connected to the data output terminals A and B are used to harmonize the logical level of the output signals derived from the flip-flop 50, e.g., when output signals are derived from opposite sides of the same storage element.

A data input terminal 75 which is used for a "write" operation is connected to the input of a third FET 74 and through a logical inverter 76 to the input of a fourth FET 78. The output of the third FET 74 is connected to the second bus B while the output of the fourth FET 76 is connected to the first bus A to enable the input data signal supplied to the data input terminal 75 to be written into either side of the memory storage element 50. The control electrodes of the third and fourth FET's 74 and 76 are concurrently energized by a "write" signal from a write input terminal 80. In order to force the data input signal into the memory cell, the first and second FET's 66 and 68 are concurrently energized by an output signal from the "write" decoder 56 which is connected to the control line 70 and 72 through the first and second ORgates 71, 73. This data "write" operation causes the memory cell 50 to assume the state of the new data information being supplied to the data input terminal 75. The "write" decoder 56 is disabled during "read" operations whereby the connection thereof to the control lines 70 and 72 has no effect on the "read" operation. Conversely, during a "write" operation, the "read" decoders 52 and 54 are disabled, and the "write" decoder 56 concurrently drives the first and second FET's 66 and 68. The net result is that two independent operands can be read out of the memory register array while data can be written into the same or any other locations in the data register array in the same memory operation interval time.

Accordingly, it may be seen that there has been provided, in accordance with the present invention, a memory array having a multiple port configuration for providing multiple access to the memory array during one cycle of memory operation.

The embodiments of the invention in which an exclusive property or privilege is claimed are defined as follows.

1. A memory system comprising:
   a data storage element,
   a first output terminal,
   a first readout means connecting said data storage element to said first output terminal,
   a second output terminal,
   a second readout means concurrently connecting said data storage element to said second output terminal,
   a first decoder means arranged to respond to a memory read operation to energize said first read out means, and,
   a second decoder arranged to respond to a memory read operation to concurrently energize said second readout means.

2. A memory system as set forth in claim 1 wherein said data storage element is a storage capacitor.

3. A memory system as set forth in claim 1 wherein said data storage element is a flip-flop and said first read-out means is connected to one side of said flip-flop and said second readout means is connected to their other side of said flip-flop.

4. A memory system as set forth in claim 1 and including a data input terminal,
   a data write means connecting said data input terminal to said data storage element, and
   a third decoder means arranged to respond to a memory write operation to energize said data write means.

5. A memory system as set forth in claim 4 wherein said data storage element is a capacitor.

6. A memory system as set forth in claim 4 wherein said data storage element is a flip-flop and said data write means is directly connected to one side of said flip-flop and is connected through a logical inverter to the other side of said flip-flop.

7. A memory system as set forth in claim 1 wherein said data storage element is formed as an integrated circuit element on a semiconductor chip.

8. A memory system as set forth in claim 2 wherein said data storage element is formed as an integrated circuit element on a semiconductor chip.

9. A memory system as set forth in claim 4 wherein said data storage element is formed as an integrated circuit element on a semiconductor chip.

10. A memory system as set forth in claim 5 wherein said data storage element is formed as an integrated circuit element on a semiconductor chip.

* * * * *